US011437261B2

(12) United States Patent
Sarode Vishwanath et al.

(10) Patent No.: US 11,437,261 B2
(45) Date of Patent: Sep. 6, 2022

(54) CRYOGENIC ELECTROSTATIC CHUCK

(71) Applicant: Applied Materials, Inc., Santa Clara, CA (US)

(72) Inventors: Yogananda Sarode Vishwanath, Bangalore (IN); Steven E. Babayan, Los Altos, CA (US); Stephen Donald Prouty, San Jose, CA (US); Álvaro García De Gorordo, Mountain View, CA (US); Andreas Schmid, Meyriez (CH); Andrew Antoine Noujaim, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 926 days.

(21) Appl. No.: 16/217,036

(22) Filed: Dec. 11, 2018

(65) Prior Publication Data

US 2020/0185248 A1    Jun. 11, 2020

(51) Int. Cl.
*H05B 3/68* (2006.01)
*H01L 21/683* (2006.01)
*H01L 21/67* (2006.01)

(52) U.S. Cl.
CPC .... *H01L 21/6833* (2013.01); *H01L 21/67103* (2013.01); *H01L 21/67213* (2013.01)

(58) Field of Classification Search
CPC .......... H01J 37/32522; H01J 37/32697; H01J 37/32715; H01J 37/32724;
(Continued)

(56) References Cited

U.S. PATENT DOCUMENTS 5,810,933 A * 9/1998 Mountsier ......... H01L 21/67109
118/724
6,219,219 B1   4/2001 Hausmann et al.
(Continued)

FOREIGN PATENT DOCUMENTS

JP    2017092267 A   5/2017
WO    2014150242 A   9/2014

OTHER PUBLICATIONS

International Search Report/Written Opinion issued to PCT/US2019/060709 dated Apr. 10, 2020.
Tawain Office Action issued to 108143886 dated Nov. 13, 2020.

*Primary Examiner* — Sang Y Paik
(74) *Attorney, Agent, or Firm* — Patterson + Sheridan, LLP

(57) ABSTRACT

Embodiments described herein relate to a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The substrate support assembly includes an electrostatic chuck (ESC), an ESC base assembly coupled to the ESC having a refrigerant channel disposed therein, and a facility plate having a coolant channel disposed therein. The facility plate includes a plate portion and a flange portion. The plate portion is coupled to the ESC base assembly and the flange portion coupled to the ESC with a seal assembly. A vacuum region is defined by the ESC, the ESC base assembly, the plate portion of the facility plate, the flange portion of the facility plate, and the seal assembly.

20 Claims, 5 Drawing Sheets

(58) Field of Classification Search
CPC ......... H01L 21/67103; H01L 21/67109; H01L 21/67213; H01L 21/67248; H01L 21/6831; H01L 21/6833; H01L 21/68757; H01L 21/68785
USPC .......................................... 219/443.1–444.1
See application file for complete search history.

(56) References Cited

U.S. PATENT DOCUMENTS

| | | | |
|---|---|---|---|
| 6,558,508 B1 | 5/2003 | Kawakami | |
| 6,949,722 B2 | 9/2005 | Strang et al. | |
| 7,161,121 B1 | 1/2007 | Steger | |
| 7,178,353 B2 | 2/2007 | Cowans et al. | |
| 7,230,204 B2 | 6/2007 | Mitrovic et al. | |
| 7,415,835 B2 | 8/2008 | Cowans et al. | |
| 7,651,583 B2 | 1/2010 | Kent et al. | |
| 7,988,872 B2 | 8/2011 | Brillhart et al. | |
| 8,007,591 B2 | 8/2011 | Hamelin | |
| 8,012,304 B2 | 9/2011 | Brillhart et al. | |
| 8,021,521 B2 | 9/2011 | Buchberger, Jr. et al. | |
| 8,034,180 B2 | 10/2011 | Brillhart et al. | |
| 8,092,638 B2 | 1/2012 | Brillhart et al. | |
| 8,092,639 B2 | 1/2012 | Buchberger, Jr. et al. | |
| 8,157,951 B2 | 4/2012 | Buchberger, Jr. et al. | |
| 8,221,580 B2 | 7/2012 | Buchberger, Jr. et al. | |
| 8,329,586 B2 | 12/2012 | Buchberger, Jr. et al. | |
| 8,337,660 B2 | 12/2012 | Buchberger, Jr. et al. | |
| 8,546,267 B2 | 10/2013 | Brillhart et al. | |
| 8,608,900 B2 | 12/2013 | Buchberger, Jr. et al. | |
| 8,801,893 B2 | 8/2014 | Brillhart et al. | |
| 8,980,044 B2 | 3/2015 | Brillhart et al. | |
| 9,779,955 B2 | 10/2017 | Lill et al. | |
| 10,283,398 B2 | 5/2019 | Tanaka et al. | |
| 2002/0014894 A1 | 2/2002 | Yonezawa et al. | |
| 2002/0036881 A1* | 3/2002 | Shamouilian | C04B 35/185 361/234 |
| 2003/0047551 A1* | 3/2003 | Worm | H01L 21/67248 219/390 |
| 2008/0017104 A1* | 1/2008 | Matyushkin | H05B 3/0047 118/696 |
| 2008/0217293 A1 | 9/2008 | Iimuro | |
| 2009/0152276 A1* | 6/2009 | Groll | B23K 9/0026 220/573.4 |
| 2009/0159590 A1* | 6/2009 | Yonekura | H01L 21/6831 219/520 |
| 2010/0122774 A1 | 5/2010 | Makabe et al. | |
| 2012/0091108 A1 | 4/2012 | Lin et al. | |
| 2014/0034239 A1 | 2/2014 | Yang et al. | |
| 2017/0133245 A1 | 5/2017 | Iizuka | |
| 2018/0076048 A1 | 3/2018 | Gohira et al. | |
| 2018/0197761 A1 | 7/2018 | Ferrara et al. | |
| 2018/0211822 A1 | 7/2018 | Gohira et al. | |
| 2018/0211824 A1 | 7/2018 | Kudo et al. | |
| 2018/0247826 A1 | 8/2018 | Nakaya et al. | |
| 2018/0350561 A1 | 12/2018 | Yamaguchi et al. | |
| 2019/0027345 A1 | 1/2019 | Ishikawa et al. | |
| 2019/0035609 A1 | 1/2019 | Tobe | |

\* cited by examiner

CRYOGENIC ELECTROSTATIC CHUCK

BACKGROUND

Field

Embodiments of the present disclosure generally relate to semiconductor manufacturing and more particularly to a substrate support assembly enabling a cryogenic temperature operation of an electrostatic chuck (ESC).

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Thus, there is a need for an improved substrate support assembly suitable for use with cryogenic temperatures.

SUMMARY

In one embodiment, a substrate support assembly is provided. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a refrigerant channel disposed therein. A facility plate has a coolant channel disposed therein. The facility plate includes a plate portion and a flange portion. The plate portion is coupled to the ESC base assembly and the flange portion coupled to the ESC with a seal assembly. A vacuum region is defined by the ESC, the ESC base assembly, the plate portion of the facility plate, the flange portion of the facility plate, and the seal assembly.

In another embodiment, a substrate support assembly is provided. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a refrigerant channel disposed therein. The refrigerant channel has a refrigerant inlet in fluid communication with a jacketed refrigerant inlet tube disposed through a facility plate, an insulator plate coupled to the facility plate, and a ground plate coupled to the facility plate. The refrigerant channel has a refrigerant outlet in fluid communication with a jacketed refrigerant outlet tube disposed through the facility plate, the insulator plate, and the ground plate coupled to the facility plate. The facility plate includes a plate portion and a flange portion. The plate portion is coupled to the ESC base assembly with one or more first screw assemblies and the flange portion is coupled to the ESC with a seal assembly. The facility plate has a coolant channel disposed therein. The seal assembly includes a polytetrafluoroethylene (PTFE) body having a helical spring disposed therein. A vacuum region is defined by the ESC, the ESC base assembly, the plate portion of the facility plate, the flange portion of the facility plate, and the seal assembly.

In yet another embodiment, a process chamber is provided. The process chamber includes a chamber body having walls and a lid defining a processing region. A substrate support assembly is disposed in the processing region. The substrate support assembly includes an electrostatic chuck (ESC) having a support surface and a bottom surface opposite the support surface. The ESC has a chucking electrode and one or more resistive heaters disposed therein. An ESC base assembly is coupled to the ESC having a refrigerant channel disposed therein. A facility plate has a coolant channel disposed therein. The facility plate includes a plate portion and a flange portion. The plate portion is coupled to the ESC base assembly and the flange portion is coupled to the ESC with a seal assembly. A vacuum region is defined by the ESC, the ESC base assembly, the plate portion of the facility plate, the flange portion of the facility plate, and the seal assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature is intended to refer to temperatures not greater than about −50 degrees Celsius.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing necessitates a substrate maintained at the cryogenic temperature.

Figure 1:
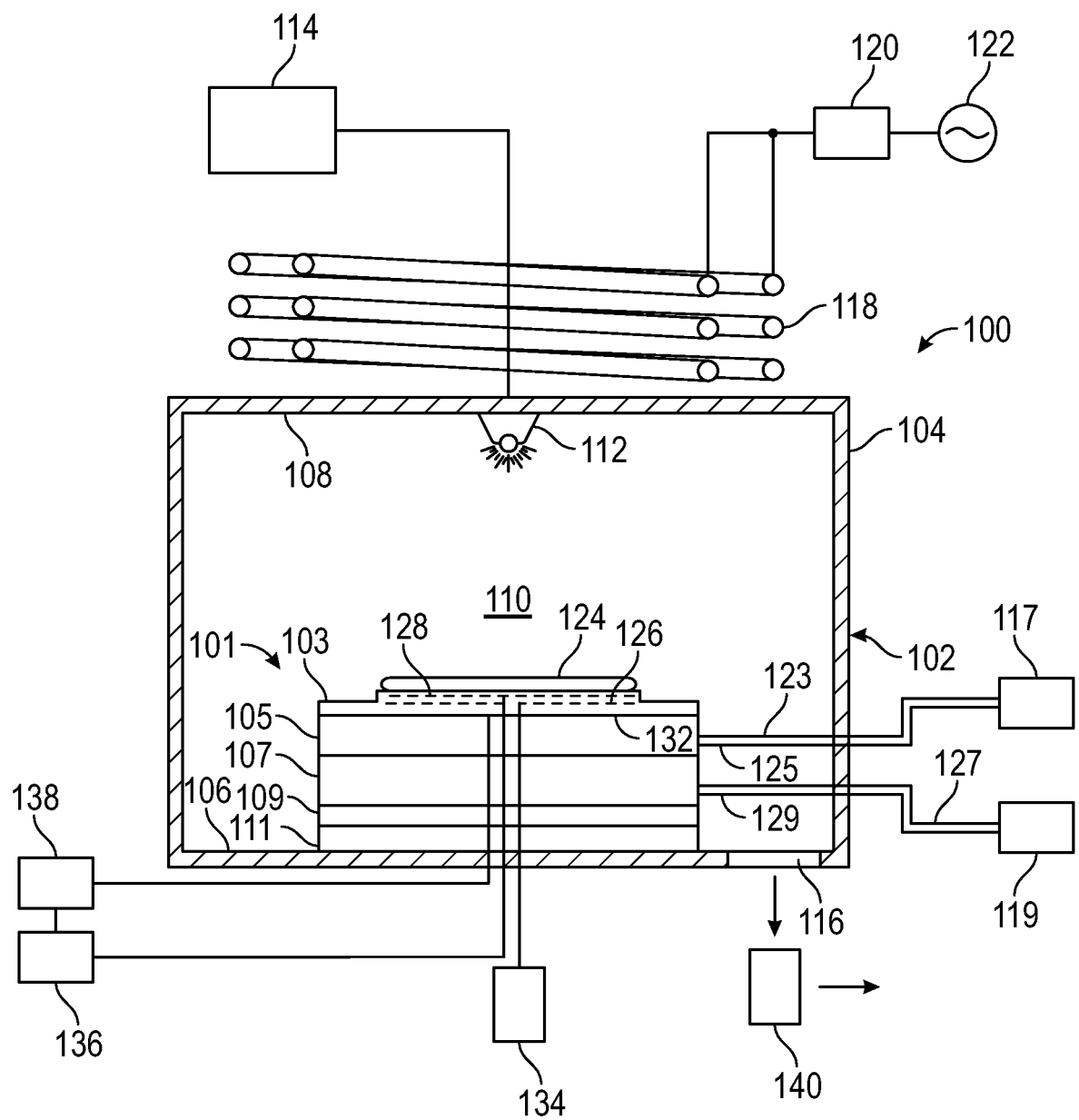
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or workpiece, such as a substrate 124, at a cryogenic temperature is desirable. Dry reactive ion etching a substrate 124 maintained at a cryogenic temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic temperature is decreased while ions continue to bombard the upward facing surface of the low-k dielectric material to form trenches with smooth, vertical sidewalls. Additionally, selectivity of etching one material versus another can be improved at the cryogenic temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The process gases may be energized to form a plasma within the processing region 110. The process gases may be energized by capacitively or inductively coupling RF power to the process gases. In the embodiment depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107 supported by a ground plate 111 is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base assembly 105 includes a refrigerant channel 416 (shown in FIGS. 4A-4C) coupled to a cryogenic chiller 117. The cryogenic chiller 117 is in fluid communication with the refrigerant channel 416 via a refrigerant inlet conduit 123 connected to an inlet 254 (shown in FIG. 2) of the refrigerant channel 416 and via a refrigerant outlet conduit 125 connected to an outlet 256 (shown in FIG. 2) of the refrigerant channel 416 such that the ESC base assembly 105 is maintained at a predetermined cryogenic temperature. In one embodiment, the cryogenic chiller 117 is coupled to an interface box to control a flow rate of the refrigerant. The refrigerant may include a material that can maintain a cryogenic temperature not greater than about −80 degrees Celsius. The cryogenic chiller 117 provides the refrigerant, which is circulated through the refrigerant channel 416 of the ESC base assembly 105. The refrigerant flowing through the refrigerant channel 416 enables the ESC base assembly 105 to be maintained at the cryogenic temperature, which assists in controlling the lateral temperature profile of the ESC 103 so that a substrate 124 disposed on the ESC 103 is uniformly maintained at a cryogenic processing temperature.

The facility plate 107 includes a coolant channel 234 (shown in FIG. 2) coupled to a chiller 119. The chiller 119 is in fluid communication with the coolant channel 234 via a coolant inlet conduit 127 connected to an inlet 240 (shown in FIG. 2) of the coolant channel 234 and via a coolant outlet conduit 129 connected to an outlet 256 (shown in FIG. 2) of the coolant channel 234 such that the facility plate 107 is maintained a predetermined ambient temperature. In one embodiment, the cryogenic chiller 117 is coupled to an interface box to control a flow rate of the coolant. The coolant may include a material that can maintain an ambient temperature between about 25 degrees Celsius to about 35 degrees Celsius. The chiller 119 provides the coolant, which is circulated through the coolant channel 234 of the facility plate 107. The coolant flowing through the coolant channel 234 enables the facility plate 107 to be maintained the predetermined ambient temperature, which assists in maintaining the insulator plate 109 at the predetermined ambient temperature.

The ESC 103 has a support surface 130 and a bottom surface 132 opposite the support surface 130. In one embodiment, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to elevate the temperature of the ESC 103 to the cryogenic processing temperature suitable for processing a substrate 124 disposed on the support surface 130. The resistive heaters 128 are coupled through the facility plate 107 to a heater power source 136. The heater power source 136 may provide 500 watts or more power to the resistive heaters 128. The heater power source 136 includes a controller (not shown) utilized to control the operation of the heater power source 136, which is generally set to heat the substrate 124 to a predetermined cryogenic temperature. In one embodiment, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, the cryogenic processing temperature is not greater than about −50 degrees Celsius. For example, the cryogenic processing temperature is between about −50 degrees Celsius to about −150 degrees Celsius.

The substrate support assembly 101 may include one or more probes disposed therein. In one embodiment, one or more low temperature optical probe assemblies 500 (shown in FIG. 5) are coupled a probe controller 138, such as a watlow controller. The probe tip 516 (shown in FIG. 5) of each of low temperature optical probes 512 (shown in FIG. 5) is disposed in the ESC 103 to determine the temperature of the ESC 103. In one embodiment, each of low temperature optical probe assemblies 500 corresponds to a zone of the plurality of laterally separated heating zones of the resistive heaters 128, wherein the low temperature optical probes measure the temperature of each zone of the ESC 103. The probe controller 138 is coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at the cryogenic processing temperature.

Figure 2:
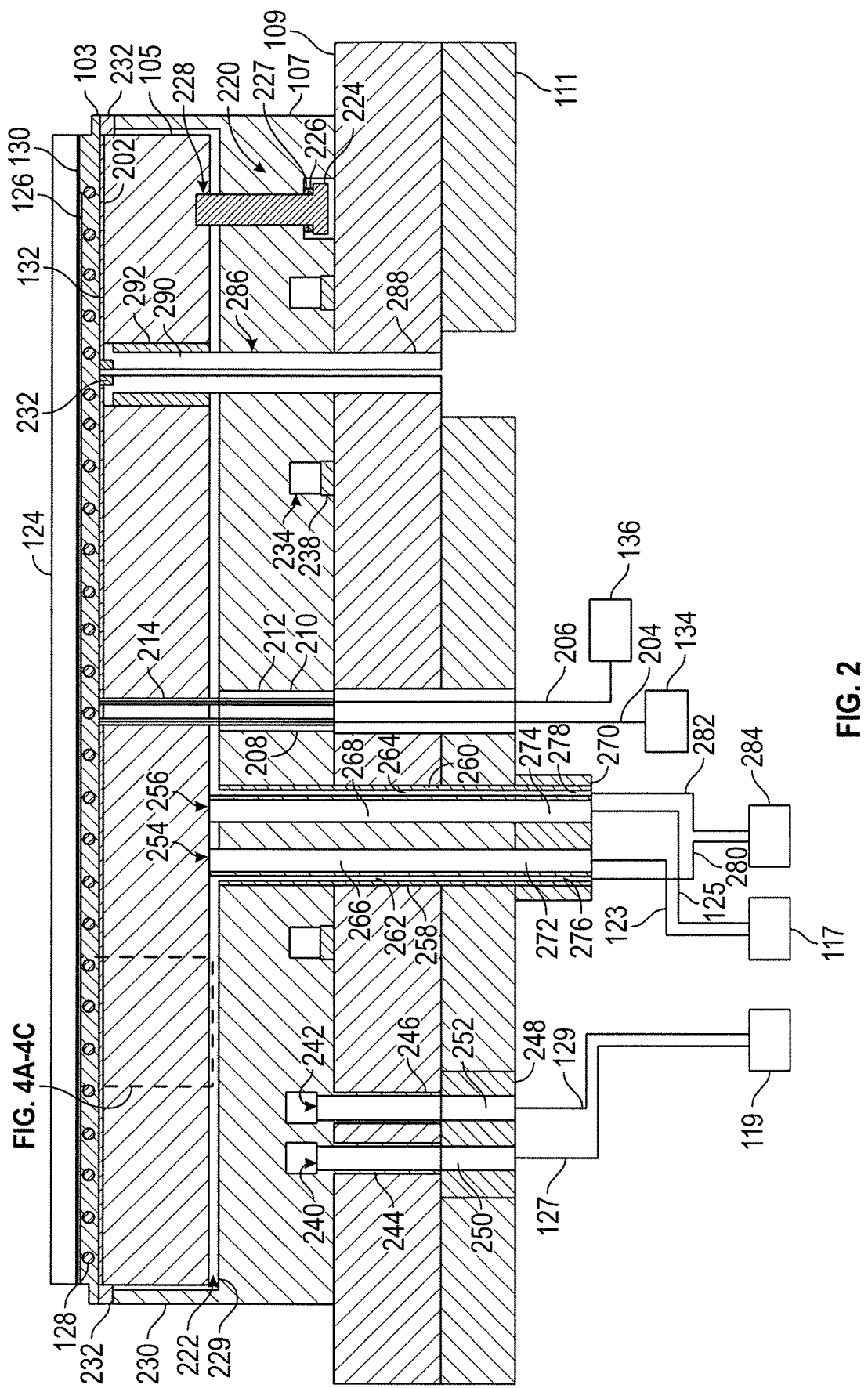
FIG. 2 is a cross-sectional schematic view of an exemplary substrate support assembly according to an embodiment.

FIG. 2 is a cross-sectional schematic view of an exemplary substrate support assembly 101 enabling cryogenic temperature operation of ESC 103 so that a substrate 124 disposed thereon is maintained at the cryogenic processing temperature. The ESC 103 is coupled to the ESC base assembly 105. In one embodiment, the ESC 103 is secured to the ESC base assembly 105 with a bonding layer 202. The bonding layer 202 may include epoxy containing materials. The chucking electrode 126 is coupled to the chucking power source 134 via a first insulated wire 204 disposed through a first bore 208 in a lower insulator 212 of the facility plate 107 and an upper insulator 214 of the ESC base assembly 105. The one or more resistive heaters 128 are coupled to the heater power source 136 via a second insulated wire 206 disposed through a second bore 210 in the lower insulator 212 of the facility plate 107 and the upper insulator 214 of the ESC base assembly 105.

The facility plate 107 includes a plate portion 229 and flange portion 230. The plate portion 229 of the ESC base assembly 105 is coupled to the facility plate 107 with one or more first screw assemblies 220 so that a vacuum region 222 is present between the ESC base assembly 105 and the facility plate 107. Each of the one or more first screw assemblies 220 includes a bolt 224 inserted through a thermal break 227 contacting the facility plate 107, a Belleville washer 226, and facility plate 107, and into a thread hole 228 of ESC base assembly 105. The thermal break 227 is in contact with the facility plate 107 to provide thermal isolation from the ESC base assembly 105 maintained at the cryogenic temperature. In one embodiment, the thermal break 227 includes a polyamide-imide (PAI) containing material. The Belleville washer 226 and bolt 224 are preloaded such that the facility plate 107 is forced against the ESC base assembly 105. The facility plate 107 includes a flange portion 230 coupled to the ESC 103 by a seal assembly 232. In one embodiment, the lower insulator 212 of the facility plate 107 maintains the vacuum region 222 via the seal assembly 232. The flange coupled to the ESC by the seal assembly 232 protects the materials of the ESC base assembly 105 from potentially flaking off from contact with process gases. The vacuum region 222 is defined by the ESC 103, ESC base assembly 105, facility plate 107, and seal assembly 232. The vacuum region 222 prevents condensation on the backside of the cooling plate, prevents process gases from entering the substrate support assembly 101 by having a pressure greater than the pressure of the processing region 110, and provides for thermal isolation between the ESC base assembly 105 and facility plate 107. In one embodiment, the facility plate 107 includes aluminum containing materials.

The coolant channel 234 of the facility plate 107 is machined in the facility plate and bonded with a cover 238. The inlet 240 of the coolant channel 234 is in fluid communication with an inlet tube 244 disposed through the insulator plate 109 and the ground plate 111. The outlet 242 of the coolant channel 234 is in fluid communication with an outlet tube 246 disposed through the insulator plate 109 and the ground plate 111. The inlet tube 244 and outlet tube 246 are connected to a manifold 248 having a manifold inlet 250 connected to the coolant inlet conduit 127 and a manifold inlet 252 connected to the coolant outlet conduit 129. In one embodiment, the manifold 248, the inlet tube 244, and the outlet tube 246 include insulating materials, such as ceramic containing materials.

Figure 4A:
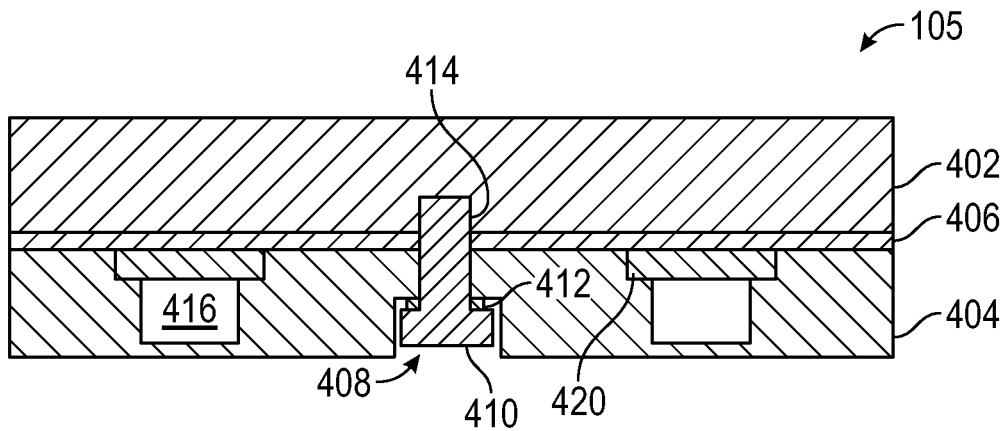
FIGS. 4A-4C are cross-sectional schematic views of an ESC base assembly according to embodiments.
Figure 4B:
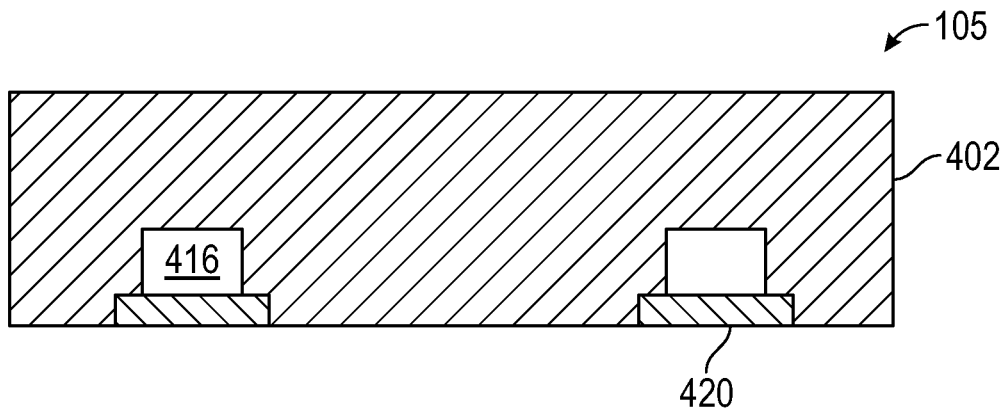
Figure 4C:
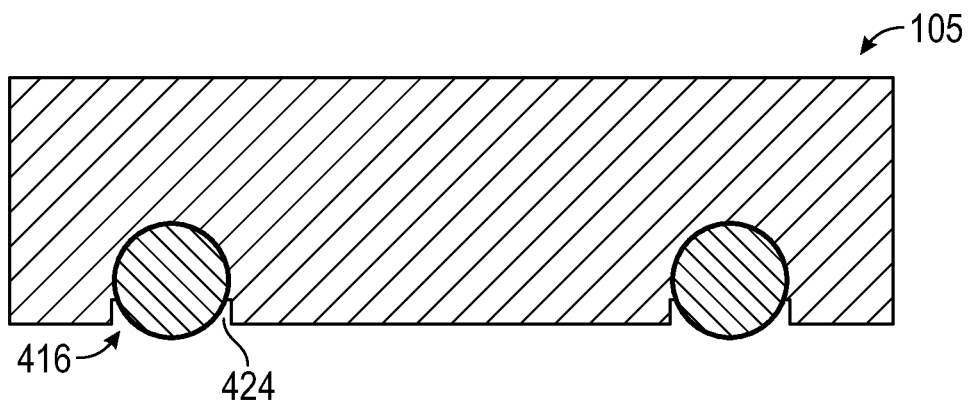

The refrigerant channel 416 of the ESC base assembly 105, described in greater detail in FIGS. 4A-4C, includes an inlet 254 of the refrigerant channel 416 in fluid communication with an jacketed inlet tube 258 disposed through the facility plate 107, the insulator plate 109, and the ground plate 111. The outlet 256 of the refrigerant channel 416 is in fluid communication with a jacketed outlet tube 260 disposed through the facility plate 107, the insulator plate 109, and the ground plate 111. The jacketed inlet tube 258 and jacketed outlet tube 260 are connected to a jacketed manifold 270. In one embodiment, the jacketed manifold 270, the jacketed inlet tube 258, and the jacketed outlet tube 260 include insulating materials, such as ceramic containing materials. The jacketed inlet tube 258 includes a fluid inlet channel 266 and a vacuum inlet channel 262. The jacketed outlet tube 260 includes a fluid outlet channel 268 and a vacuum outlet channel 264. The jacketed manifold 270 includes a refrigerant inlet 272, vacuum inlet 276, refrigerant outlet 274, and vacuum outlet 278. The refrigerant inlet 272 is connected to the refrigerant inlet conduit 123 and a refrigerant outlet 274 connected to the refrigerant outlet conduit 125. The vacuum inlet 276 is connected to a vacuum inlet conduit 280 in fluid communication with a vacuum source 284 and the vacuum outlet 278 is connected to a vacuum outlet conduit 282 in fluid communication with the vacuum source 284. Coupling the vacuum source 284 to the vacuum region 222 enables a pressure greater than the pressure of the processing region 110 to be maintained in the vacuum region 222. In one embodiment, the fluid inlet channel 266 and the fluid outlet channel 268 are coupled to the ESC base assembly 105 by the seal assembly 232 to maintain the pressure in the vacuum region 222.

The substrate support assembly 101 also includes one or more lift pin assemblies 286 for accommodating lift pins (not shown) for elevating the substrate 124 above the support surface 130 of the ESC 103 to facilitate robotic transfer into and out of the plasma processing chamber 100. Each of the one or more lift pin assemblies 286 includes a lift pin guide 288 disposed through the ESC 103, the ESC base assembly 105, the facility plate 107, the insulator plate 109, and the ground plate 111. A portion 290 of the lift pin guide 288 disposed through the ESC base assembly 105 is surrounded by a threaded bushing 292 holding the lift pin guide 288 in position. The lift pin guide 288 is coupled to the ESC 103 by the seal assembly 232 to maintain the pressure in the vacuum region 222. In one embodiment, the ESC 103 includes one or more gas passages for providing backside heat transfer gas, such as helium, to an interstitial space defined between the substrate 124 and the support surface 130 of the ESC 103. Each of the one or more one or more gas passages is disposed through the ESC 103, the ESC base assembly 105, the facility plate 107, the insulator plate 109, and the ground plate 111. Each of the one or more gas passages is coupled to the ESC 103 by the seal assembly 232 to maintain the pressure in the vacuum region 222.

Figure 3:
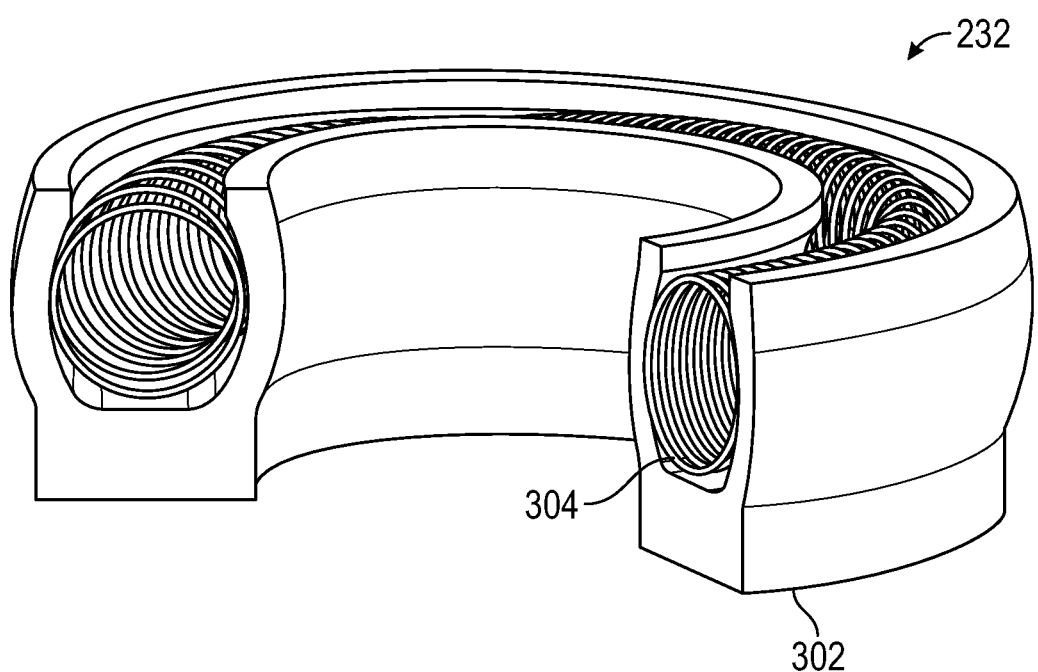
FIG. 3 is a schematic view of a seal assembly according to an embodiment.

FIG. 3 is a schematic view of the seal assembly 232. The seal assembly includes a polytetrafluoroethylene (PTFE) body 302 having a helical spring 304 disposed therein. In one embodiment, the helical spring 304 includes stainless steel, nickel alloy, nickel-chromium alloy, and cobalt-chromium-nickel-molybdenum alloy containing materials. The seal assembly 232 allows for sealing of the ESC 103 at cryogenic temperatures.

FIG. 4A is a cross-sectional schematic view of the ESC base assembly 105 having an ESC base 402 coupled to a refrigerant channel plate 404. The ESC base 402 includes molybdenum or carbon fiber containing materials to substantially match the coefficient of thermal expansion of the ESC 103. In one embodiment, the refrigerant channel plate 404 consists of aluminum containing materials. The refrigerant channel plate 404 includes the refrigerant channel 416 of the ESC base assembly 105. The refrigerant channel 416 is machined in the refrigerant channel plate 404 and bonded with a cover 420. The inlet 254 of the refrigerant channel 416 is in fluid communication with the jacketed inlet tube 258 and the outlet 256 of the refrigerant channel 416 is in fluid communication with the jacketed outlet tube 260. The ESC base 402 is coupled to the refrigerant channel plate 404 via one or more second screw assemblies 408 with a thermal conductive gasket 406 therebetween to substantially match the coefficient of thermal expansion of the ESC 103 and ESC base 402. Each of the one or more second screw assemblies 408 includes a bolt 410 inserted through a Belleville washer 412 and ESC base 402, and into a thread hole 414 of ESC base 402. The Belleville washer 412 and bolt 410 are preloaded such that the refrigerant channel plate 404 is forced against the ESC base 402.

FIG. 4B is a cross-sectional schematic view of the ESC base assembly 105 having an ESC base 402 with the refrigerant channel 416. The ESC base 402 includes molybdenum or carbon fiber containing materials to substantially match the coefficient of thermal expansion of the ESC 103. The refrigerant channel 416 is machined in the ESC base 402 and bonded with a cover 420. The inlet 254 of the refrigerant channel 416 is in fluid communication with the jacketed inlet tube 258 and the outlet 256 of the refrigerant channel 416 is in fluid communication with the jacketed outlet tube 260.

FIG. 4C is a cross-sectional schematic view of the ESC base assembly 105 having an ESC base 402 with the refrigerant channel 416. The ESC base 402 includes molybdenum or carbon fiber containing materials to substantially match the coefficient of thermal expansion of the ESC 103. The refrigerant channel 416 is a coil disposed in a space 424 machined in the ESC base 402. The inlet 254 of the refrigerant channel 416 is in fluid communication with the jacketed inlet tube 258 and the outlet 256 of the refrigerant channel 416 is in fluid communication with the jacketed outlet tube 260.

Figure 5:
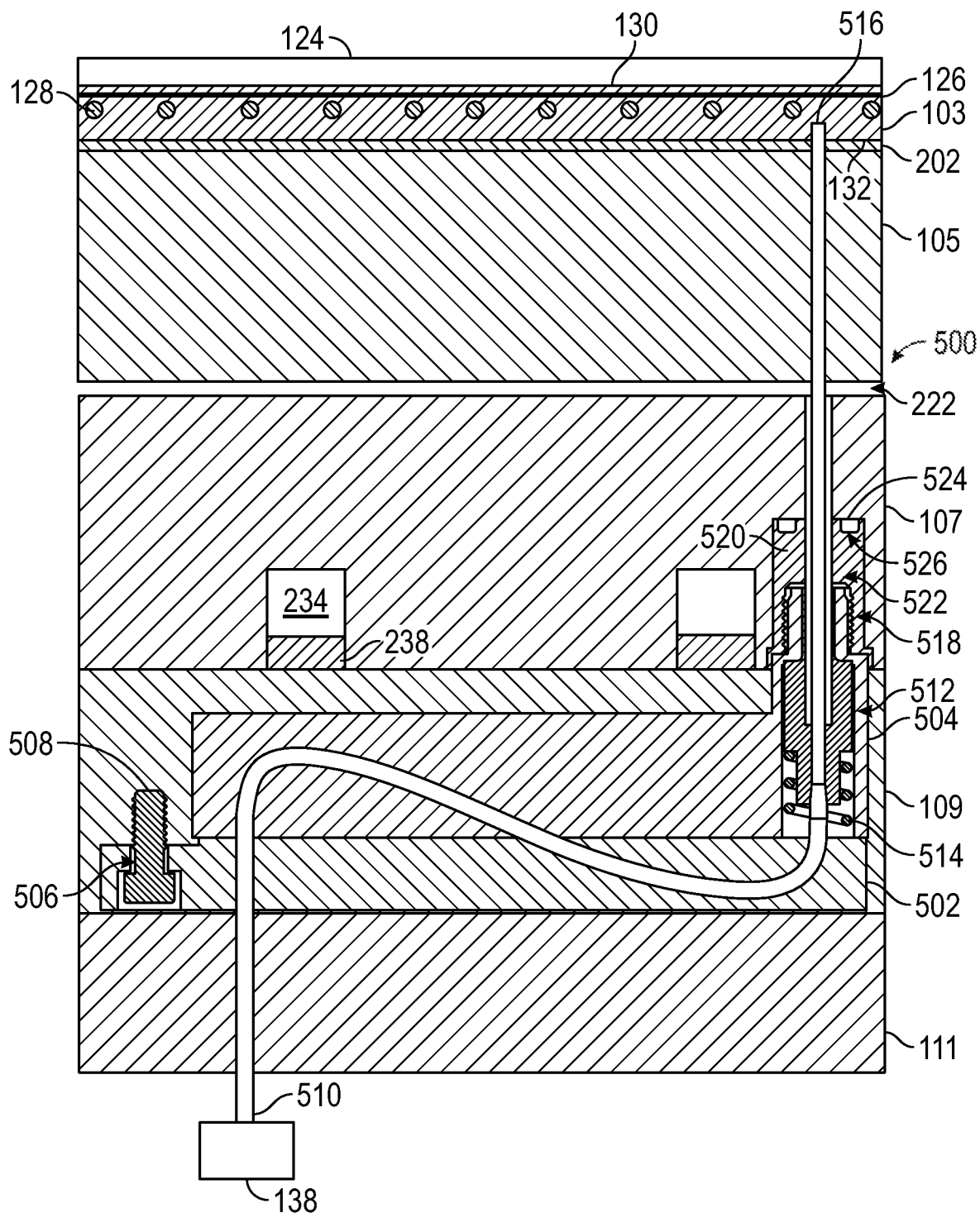
FIG. 5 is a cross-sectional schematic view of a low temperature optical probe assemblies according to an embodiment.

FIG. 5 is a cross-sectional schematic view of one of the one or more low temperature optical probe assemblies 500. Each of the low temperature optical probe assemblies 500 includes an optical fiber 510 connected to the probe controller 138, such as a watlow controller. Each of the low temperature optical probe assemblies 500 includes a mount housing 502 disposed in the insulator plate 109 and a probe housing 504 disposed in the insulator plate 109 and facility plate 107. The mount housing 502 is coupled to the probe housing 504 with a probe mounting bolt 506 inserted through the mount housing 502 and into a thread hole 508 of the probe housing 504 so that the mount housing 502 is forced against the probe housing 504. The optical fiber 510 is connected to a low temperature optical probe 512 disposed in the probe housing 504. The probe housing 504 includes a spring 514 to provide for vertical movement of the low temperature optical probe 512 so that a probe tip 516 of the low temperature optical probe 512 is configured to contact ESC 103. In the facility plate 107, a threaded bushing 518 surrounds the probe housing 504. The internal portion 520 of the threaded bushing 518 is coupled to the probe housing 504 with an internal seal 522. The internal seal 522 allows the probe tip 516 to maintain contact the ESC 103. In one embodiment, the internal seal 522 is the seal assembly 232. In another embodiment, the internal seal 522 is an elastomer seal. The external portion 524 of the threaded bushing 518 is coupled to the facility plate 107 with an external seal 526. The external seal 526 seals the probe housing 504 from the vacuum region 222. In one embodiment, the external seal 526 is the seal assembly 232.

In summation, a substrate support assembly that enables cryogenic temperature operation of an electrostatic chuck (ESC) so that a substrate disposed thereon is maintained at the cryogenic temperature while other surfaces of a processing chamber are maintained at a different temperature is provided. The substrate support assembly is disposed the process chamber includes an ESC, an ESC base assembly 105 coupled to the ESC 103 and a facility plate 107, and an insulator plate 109 coupled to a ground plate 111. A refrigerant flowing through the refrigerant channel of the ESC base assembly 105 coupled to the ESC 103 enables the ESC base assembly 105 to be maintained a predetermined cryogenic temperature, which assists in controlling the lateral temperature profile of the ESC 103 so that a substrate 124 disposed on the ESC 103 is uniformly maintained at a cryogenic processing temperature. The coolant flowing through the coolant channel 234 of the facility plate 107 enables the facility plate 107 to be maintained the ambient temperature, which assists in maintaining the insulator plate 109 and ground plate 111 at the ambient temperature.

While the foregoing is directed to examples of the present disclosure, other and further examples of the disclosure may be devised without departing from the basic scope thereof, and the scope thereof is determined by the claims that follow.

What is claimed is:

1. A substrate support assembly, comprising:
an electrostatic chuck (ESC) having a support surface and a bottom surface opposite the support surface, the ESC having a chucking electrode and one or more resistive heaters disposed therein;
an ESC base assembly coupled to the ESC having a refrigerant channel disposed therein;
a facility plate having a coolant channel disposed therein, the facility plate comprises a plate portion and a flange portion, the plate portion coupled to the ESC base assembly and the flange portion coupled to a portion of the bottom surface of the ESC extending past a side wall of the ESC base assembly with a seal assembly; and
a vacuum region defined by the ESC, the ESC base assembly, the plate portion of the facility plate, the flange portion of the facility plate, and the seal assembly at the portion of the bottom surface of the ESC extending past the side wall of the ESC base assembly.

2. The substrate support assembly of claim 1, further comprising an insulator plate coupled to the facility plate and a ground plate coupled to the insulator plate.

3. The substrate support assembly of claim 1, wherein the ESC base assembly is secured to the ESC with a bonding layer.

4. The substrate support assembly of claim 1, wherein the ESC comprises alumina ($Al_2O_3$) and/or aluminum nitride (AlN) containing materials.

5. The substrate support assembly of claim 1, wherein the ESC base assembly comprises molybdenum or carbon fiber containing materials.

6. The substrate support assembly of claim 1, wherein the refrigerant channel having an inlet and an outlet is operable to be connected to a cryogenic chiller in fluid communication with the refrigerant channel via a refrigerant inlet conduit connected to the inlet of the refrigerant channel and a refrigerant outlet conduit connected to the outlet of the refrigerant channel.

7. The substrate support assembly of claim 1, wherein the coolant channel having an inlet and an outlet is operable to be connected to a chiller in fluid communication with the coolant channel via a coolant inlet conduit connected to the inlet of the coolant channel and a coolant outlet conduit connected to the outlet of the coolant channel.

8. The substrate support assembly of claim 1, wherein the seal assembly comprises a polytetrafluoroethylene (PTFE) body having a helical spring disposed therein to seal the vacuum region at a temperature between about −250 degrees Celsius to about 250 degrees Celsius.

9. The substrate support assembly of claim 8, wherein the helical spring comprises stainless steel, nickel alloy, nickel-chromium alloy, and cobalt-chromium-nickel-molybdenum alloy containing materials.

10. The substrate support assembly of claim 1, wherein the vacuum region comprises a vacuum inlet operable to be connected to a vacuum inlet conduit in fluid communication with a vacuum source and vacuum outlet operable to be connected to a vacuum outlet conduit in fluid communication with the vacuum source to maintain vacuum pressure in the vacuum region greater than a pressure of a processing region of a processing chamber.

11. The substrate support assembly of claim 1, further comprising one or more probe assemblies coupled to a probe controller, each of the one or more probe assemblies comprise a probe tip contacting the ESC.

12. The substrate support assembly of claim 11, wherein a heater power source of the one or more resistive heaters having a controller is connected to the probe controller.

13. A substrate support assembly, comprising:
an electrostatic chuck (ESC) having a support surface and a bottom surface opposite the support surface, the ESC having a chucking electrode and one or more resistive heaters disposed therein;
an ESC base assembly coupled to the ESC having a refrigerant channel disposed therein, the refrigerant channel having a refrigerant inlet in fluid communication with a jacketed refrigerant inlet tube disposed through a facility plate, an insulator plate coupled to the facility plate, and a ground plate coupled to the facility plate, the refrigerant channel having a refrigerant outlet in fluid communication with a jacketed refrigerant outlet tube disposed through the facility plate, the insulator plate, and the ground plate coupled to the facility plate;
the facility plate comprises a plate portion and a flange portion, the plate portion coupled to the ESC base assembly with one or more first screw assemblies and the flange portion coupled to a portion of the bottom surface of the ESC extending past a side wall of the ESC base assembly with a seal assembly, the facility plate having a coolant channel disposed therein, the seal assembly comprises a polytetrafluoroethylene (PTFE) body having a helical spring disposed therein;
a vacuum region defined by the ESC, the ESC base assembly, the plate portion of the facility plate, the flange portion of the facility plate, and the seal assembly at the portion of the bottom surface of the ESC extending past the side wall of the ESC base assembly.

14. The substrate support assembly of claim 13, wherein the helical spring comprises stainless steel, nickel alloy, nickel-chromium alloy, and cobalt-chromium-nickel-molybdenum alloy containing materials.

15. The substrate support assembly of claim 13, wherein each of the one or more first screw assemblies includes a bolt inserted through a thermal break, a Belleville washer and the facility plate, and into a thread hole of ESC base assembly, the Belleville washer and bolt force the facility plate against the ESC base assembly.

16. A process chamber comprising:
a chamber body having walls and a lid defining a processing region;
a substrate support assembly disposed in the processing region, the substrate support assembly comprises:
an electrostatic chuck (ESC) having a support surface and a bottom surface opposite the support surface, the ESC having a chucking electrode and one or more resistive heaters disposed therein;
an ESC base assembly coupled to the ESC having a refrigerant channel disposed therein;
a facility plate having a coolant channel disposed therein, the facility plate comprises a plate portion and a flange portion, the plate portion coupled to the ESC base assembly and the flange portion coupled to a portion of the bottom surface of the ESC extending past a side wall of the ESC base assembly with a seal assembly; and
a vacuum region defined by the ESC, the ESC base assembly, the plate portion of the facility plate, the flange portion of the facility plate, and the seal assembly at the portion of the bottom surface of the ESC extending past the side wall of the ESC base assembly.

17. The substrate support assembly of claim 16, further comprising an insulator plate coupled to the facility plate and a ground plate coupled to the insulator plate.

18. The substrate support assembly of claim 16, wherein the ESC base assembly is secured to the ESC with a bonding layer.

19. The substrate support assembly of claim 16, wherein the ESC comprises alumina ($Al_2O_3$) and/or aluminum nitride (AlN) containing materials.

20. The substrate support assembly of claim 16, wherein the ESC base assembly comprises molybdenum or carbon fiber containing materials.

* * * * *